United States Patent [19]

Best

[11] 4,424,460
[45] Jan. 3, 1984

[54] APPARATUS AND METHOD FOR PROVIDING A LOGICAL EXCLUSIVE OR/EXCLUSIVE NOR FUNCTION

[75] Inventor: David W. Best, Marion, Iowa

[73] Assignee: Rockwell International Corporation, El Segundo, Calif.

[21] Appl. No.: 283,268

[22] Filed: Jul. 14, 1981

[51] Int. Cl.³ .............................................. H03K 19/21
[52] U.S. Cl. ..................................... 307/471; 307/243
[58] Field of Search .............. 307/471, 472, 448, 451, 307/313, 243; 340/784, 803

[56] References Cited

U.S. PATENT DOCUMENTS

| | | | |
|---|---|---|---|
| 3,500,062 | 3/1970 | Annis | 307/471 |
| 3,668,425 | 6/1972 | Schmidt, Jr. | 307/471 |
| 3,683,202 | 8/1972 | Schmidt, Jr. | 307/471 |
| 3,781,864 | 12/1973 | Fujita | 307/313 |
| 3,925,978 | 12/1975 | Naito | 307/451 |

FOREIGN PATENT DOCUMENTS

| | | | |
|---|---|---|---|
| 52-19058 | 2/1977 | Japan | 307/471 |
| 52-19059 | 2/1977 | Japan | 307/471 |

*Primary Examiner*—Larry N. Anagnos
*Assistant Examiner*—David R. Bertelson
*Attorney, Agent, or Firm*—Bruce C. Lutz; Howard R. Greenberg; H. Fredrick Hamann

[57] ABSTRACT

Circuits are illustrated using CMOS design techniques for incorporating N and P channel transistors into a circuit to obtain the functions of exclusive OR and exclusive NOR signal generation. This is accomplished by utilizing a given logic value signal as a control signal to pass the other input signal for three of the four possible logic value conditions. The fourth condition must generate the output signal from a selected one of the input signals, through the use of an inverter.

4 Claims, 4 Drawing Figures

TABLE 1

TABLE 2

APPARATUS AND METHOD FOR PROVIDING A LOGICAL EXCLUSIVE OR/EXCLUSIVE NOR FUNCTION

IN INVENTION

The present invention is generally directed to electronics and more specifically to implementation of logic functions. Even more specifically, the present invention is concerned with the method of and the apparatus for obtaining the logical exclusive OR/NOR function for two input signals.

BACKGROUND

As weight requirements for electronic circuitry become more strict along with power requirements and physical size, it is important that logical functions be implemented using the fewest number of components. Fewer components reduces not only size and weight but typically requires less power to operate. Further, the more active components which are involved in a circuit, the more likely there are to be additional stages of signal propagation delays in the time of transmission of the signal from the input to the output of a given logic function.

In the past, a conventional exclusive OR gate generator design required the use of 8 transistors to implement and this design created 2 stages of propagation delay in the time for travel through a conventional dual input exclusive OR gate signal generator.

The present design reduces the exclusive OR gate signal generator implementation for two input to six FET's and forms only one stage of propagation delay for non-identical inputs, although two stages of propagation delay is introduced where the two inputs are both logical one and need to generate a logical zero as an output signal. Thus, the present invention requires less components, takes less time to implement the function and requires less space and additionally economizes on power requirements as well as material utilized in producing the finished product. The savings of a few transistors in an exclusive OR gate may not appear, at first glance, to be a very significant savings. However, when it is realized that there are many exclusive OR gates used on a single LSI chip, the saving can make the difference as to whether or not an operable system can be produced in economical quantities.

The same advantages are obtained in the design of an exclusive NOR gate signal generator since the circuit to obtain this function is complementary in design.

In view of the above, it is an object of this invention to provide an improved logic circuit design.

Other objects and advantages of the present invention may be ascertained from a reading of the specification and appended claims in conjunction with the drawings wherein:

FIG. 1 is a schematic diagram of an exclusive OR embodiment of the present inventive concept;

Table 1 is a truth table illustrating the operation of an exclusive OR gate signal generator to be used in the explanation of the operation of FIG. 1;

FIG. 2 is a schematic diagram of one embodiment of the present inventive concept as applied to an exclusive NOR gate signal generator; and Table 2 is a truth table illustrating the operation of an exclusive NOR gate signal generator to be used in the explanation of the operation of FIG. 2.

DETAILED DESCRIPTION

Figure 1:
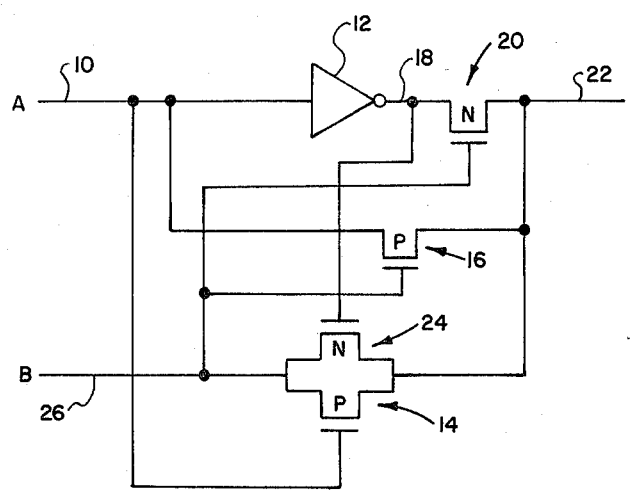

In FIG. 1 a lead 10 is connected to provide a logic A input signal to an inverter 12 as well as providing it as a control signal to operate a P channel FET transistor generally designated as 14 and connected to a source of an P channel FET transistor generally designated as 16. An output of inverter 12 is supplied on a lead 18 to the source of a N channel FET transistor generally designated as 20 whose drain is connected to an apparatus output 22 for the exclusive OR circuit. The output lead 18 is also connected as a control input for a N channel FET transistor generally designated as 24. The leads 10 and 18 are connected to the gates of FET transistors 14 and 24 respectively. A further input lead 26 for providing B logic signal inputs is connected to pass signals through a transmission gate formed by transistors 14 and 24 via the source leads of each of these transistors. The input lead 26 is also connected to the gate leads of transistors 16 and 20 for the purpose of controlling the ON and OFF conditions of these transistors. The drain leads of transistors 14, 16 and 24 are all connected to output lead 22.

Table 1 represents the states of the exclusive OR circuit of FIG. 1 wherein the upper and left hand outer surfaces of the illustrated box contain representative logic values of the A and B inputs respectively. Within the box in the rows or columns, logic values are presented representative of the output signal appearing on lead 22 with given assumed logic values at input 10 and 26.

Figure 2:
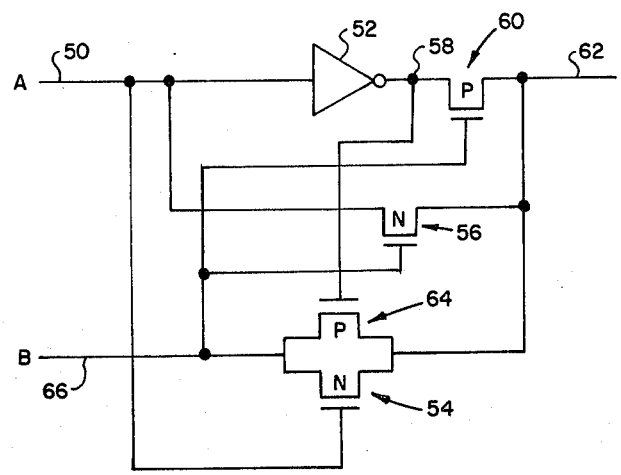

In FIG. 2 an exclusive NOR circuit is illustrated which is a duplicate of FIG. 1 except that the P and N channel transistors are reversed in their circuit positions. Accordingly, the logic A input 50 is connected to provide input signals to the inverter 52 and to provide a control input to N channel transistor 54 as well as being passed through an N channel transistor 56 when transistor 56 is turned to an ON condition. An output of inverter 52 is supplied to a lead 58 which is connected to supply signals through a P channel FET transistor generally designated as 60 having its drain lead connected to an apparatus output lead 62. Lead 58 is also connected to supply control signals to a P channel transistor 64 which in conjunction with transistor 54 provides the function of a transmission gate. A B logic signal is provided on an input terminal 66 which supplies control signals to the gates of transistors 56 and 60 and is also connected to the sources of transistors 54 and 64 so that it can be passed through these transistors when the resulting transmission gate is turned to an ON condition. The drains of transistors 54, 56 and 64 are all connected to output terminal 62.

Table 2 represents the logic conditions obtained in the exclusive NOR circuit of FIG. 2 with given assumed conditions. This table is drawn on the same basis as that of table 1 wherein the logic values assumed are shown on the outside upper and left hand portions of the box for the A and B inputs respectively and the resulting values appearing at output 62 are presented in the box at the juncture of the various rows and columns.

OPERATION

Referring first to FIG. 1 and its associated Table 1, it will be noted that if logic zero is applied at the A and B inputs, a logic zero should appear at output 22. Under this logic condition, the transistors 14 and 24 form a logic gate which is in a an ON condition since a logic zero will activate a P channel transistor and the inverted logic zero of A after being inverted by inverter 12 forms a logic one to be input on the P channel transistor 24. Thus, the B input signal will be passed to output 22 as a logic zero. It may be noted that the logic zero input on line 26 also turns transistor 16 to an ON condition and the logic zero from lead 10 is also passed to the output 22. However, the transmission gate using transistors 14 and 24 is more efficient and thus the logic B input signal is a more predominant force at output 22.

If the logic A input is changed to a logic one, the lower transmission gate is turned OFF although FET 16 remains ON. FET 20 remains OFF as it was in the previous situation. Since FET 16 is ON, it passes the logic one from input A on lead 10 to the output 22 and satisfies the logic of Table 1. When the two inputs are reversed such that the B input 26 is logic one and the A input is logic zero, transistor 20 is turned ON and transistor 16 is turned OFF. The transmission gate utilizing transistors 14 and 26 is again turned ON. Thus, the B input of logic one is transmitted to the output and the logic zero input on lead 10 is inverted by inverter 12 and passed through P channel gate 20 to the output 22. Again, since the transmission gate using the two transistors is more efficient (has a lower voltage drop) the B logic signal has more influence as to the voltage level at output 22.

Although in theory, a logic one would always have a given value, in actual practice the logic one signal is valid over a range of 3.4 to 5 volts in accordance with TTL design standards. Likewise, a logic zero has a range of zero to 1.8 volts. Thus, the two logic values, after being passed through the gates and inverters, will not necessarily have identical values and one of them will have more influence in determining the exact logic value at the output.

In the remaining condition of the Table where both inputs are a logic one, it is desirable that the output 22 be a logic zero. Under this condition, the only gate that is in an ON condition is the gate incorporating the N channel transistor 20 which inverts the logic one from input A with inverter 12 to provide a logic zero output at 18 which is transmitted through gate 20 to output 22.

It will be seen from the above that the signal passed to the output is under the control of a logic zero input for three of the four conditions. In the first condition, a logic zero input control signal is attempting to pass a logic zero to the output. In the next two conditions, the logic zero input control signal is passing the opposing or complementary logic one signal to the output. Since the inverted output of inverter 12 does not have much effect or influence on the voltage levels of output 22 in determining the logic level for the first three situations, the only real reason for this switch and inverter is to generate a logic zero output when both of the inputs are a logic one. However, since the inverted signal is available, it can also be used to provide a more efficient operation of a transmission gate in the dual controlled gate comprising transistors 14 and 24.

Referring now to FIG. 2 and Table 2, it will be noted that this exclusive NOR gate operates on much the same principles as does FIG. 1. In accordance with the values shown in Table 2, the exact opposite is desired from the given sets of inputs. This may be easily accomplished by changing the individual FET transistors to the opposite channel type. The result is that the indicated logic one output is generated for logic zero inputs on the A and B leads through the use of inverter 52 while the remaining situations utilize the signal incorporating a logic one to pass the remaining signal through to the output. As an example, if the A input is a logic one and the B input is a logic zero, the logic A input on lead 50 turns transistor 54 ON as well as, in its inverted state, turning transistor 64 ON. This then passes the logic zero of the B input signal on lead 66 to output 62. While it is true that the logic zero input of lead 66 also turns transistor 60 to a ON condition, the influence of the logic B signal at the output prevails over the inverted signal as obtained from 52 and passed through P channel transistor 60 to the output.

Since the circuit is operationally so much like FIG. 1, it is believed that further comment on FIG. 2 is unnecessary.

Although one embodiment has been shown of each of the exclusive OR and exclusive NOR logic circuit generators, it is to be realized that the teachings of the invention are broad enough to encompass other variations of accomplishing the claimed logical circuit.

According, I wish to be limited only by the scope of the appended claims, wherein I claim:

1. Apparatus for providing a logical exclusive OR function comprising, in combination:
   first means for providing a first logical input signal to be exclusively OR'd;
   second input means for supplying a second signal to be exclusively OR'd;
   output means for providing a output signal indicative in logic value of the exclusive OR combination of said first and second signals;
   first transmission gate means, including control means connected between said second logic value input signal and said outut means and further connected to said first logic value signal means for passing said second logic value signal to said output means in response to a logic zero control signal from said first input means;
   second transmission gate means connected between said first logic value input signal and said output means, said second transmission gates means including control means connected to said second logic value signal whereby said first logic value signals are passed to said output means when said second logic value signals are in a logic zero condition; and
   third transmission gate means including logic value inversion means and control input means, connected for passing said first logic value signals to said output means in an inverted condition whenever said second logic value signal is in a logic one condition.

2. Apparatus as claimed in claim 1 wherein:
   said first transmission gate includes both P channel and N channel FET's;
   said second transmission gate means includes only an P channel FET; and
   said third transmission gate means includes only a N channel FET.

3. Apparatus for providing a logical exclusive NOR function comprising, in combination:
   first means for providing a first logical input signal to be exclusively NOR'd;
   second input means for supplying a second signal to be exclusively NOR'd;
   output means for providing a output signal indicative in logic value of the exclusive NOR combination of said first and second signals;

first transmission gate means, including control means connected between said second logic value input signal and said output means and further connected to said first logic value signal means for passing said second logic value signal to said output means in response to a logic one control signal from said first input means;

second transmission gate means connected between said first logic value input signal and said output means, said second transmission gates means including control means connected to said second logic value signal whereby said first logic value signals are passed to said output means when said second logic value signals are in a logic one condition; and third transmission gate means including logic value inversion means and control input means, connected for passing said first logic value signals to said output means in an inverted condition whenever said second logic value signal is in a logic zero condition.

4. Apparatus as claimed in claim 3 wherein:

said first transmission gate includes both P channel and N channel FET's;

said second transmission gate means includes only an N channel FET; and said third transmission gate means includes only a P channel FET.

* * * * *